(12) United States Patent
Moreyra Gonzalez et al.

(10) Patent No.: US 11,657,862 B2
(45) Date of Patent: May 23, 2023

(54) ELECTRICALLY COUPLED TRACE ROUTING CONFIGURATION IN MULTIPLE LAYERS

(71) Applicant: Intel Corporation, Santa Clara, CA (US)

(72) Inventors: Rogelio Alfonso Moreyra Gonzalez, Guadalajara (MX); Jose Angel Ramos Martinez, Tlaquepaque (MX); James McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 914 days.

(21) Appl. No.: 16/361,837

(22) Filed: Mar. 22, 2019

(65) Prior Publication Data

US 2020/0302978 A1 Sep. 24, 2020

(51) Int. Cl.

| G11C 5/06 | (2006.01) |
|---|---|
| G11C 7/22 | (2006.01) |
| H05K 1/18 | (2006.01) |
| H05K 1/02 | (2006.01) |
| G11C 5/04 | (2006.01) |

(52) U.S. Cl.
CPC ........... *G11C 7/222* (2013.01); *H05K 1/0298* (2013.01); *H05K 1/181* (2013.01); *G11C 5/04* (2013.01); *H05K 2201/09227* (2013.01); *H05K 2201/09327* (2013.01); *H05K 2201/10159* (2013.01)

(58) Field of Classification Search
CPC ........ G11C 7/222; G11C 5/04; H05K 1/0298; H05K 1/181
USPC .......................................................... 365/63
See application file for complete search history.

(56) References Cited

U.S. PATENT DOCUMENTS

| 10,636,773 B2 * | 4/2020 | Kuo ...................... H01L 25/105 |
| 2001/0040796 A1 * | 11/2001 | Kollipara ................. G11C 5/00 361/760 |
| 2005/0194614 A1 * | 9/2005 | Eggers ................... H01L 27/105 257/209 |
| 2019/0067264 A1 * | 2/2019 | Fujiwara ................ G11C 5/063 |
| 2021/0398589 A1 * | 12/2021 | Nien ..................... H01L 23/528 |

* cited by examiner

*Primary Examiner* — Vu A Le
(74) *Attorney, Agent, or Firm* — Schwabe, Williamson & Wyatt P.C.

(57) ABSTRACT

Embodiments herein relate to systems, apparatuses, or processes directed to facilitating increased clock speeds on a substrate by lowering the impedance of traces that provide clock signals to components such as DRAM. For example, embodiments may include a substrate with a first layer and a second layer parallel to the first layer with a first trace coupled with the first layer in a routing configuration and a second trace coupled with the second layer in the routing configuration, where the routing configuration of the first trace and the second trace substantially overlap each other with respect to an axis perpendicular to the first layer and the second layer, and where the first trace and the second trace are electrically coupled by a first and a second electrical coupling perpendicular to the first layer and the second layer.

26 Claims, 5 Drawing Sheets

ELECTRICALLY COUPLED TRACE ROUTING CONFIGURATION IN MULTIPLE LAYERS

FIELD

Embodiments of the present disclosure generally relate to the field of printed circuit board (PCB) manufacture, and in particular PCBs with trace routing in multiple layers.

BACKGROUND

Continued demand for mobile electronics and other devices such as smart phones and ultrabooks is a driving force for increasing product functionality and performance.

DETAILED DESCRIPTION

Figure 1:
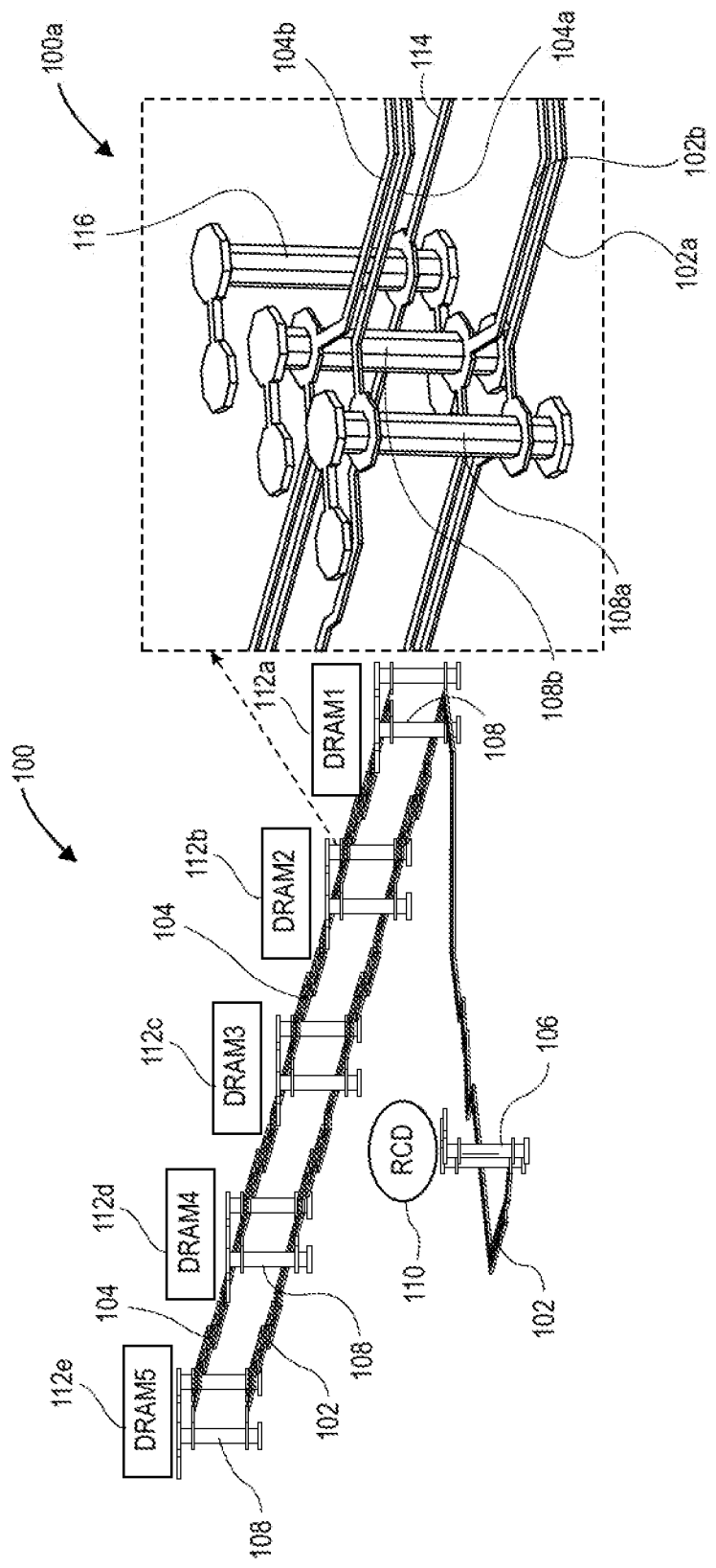
FIG. 1 is an example of differential trace routing on a top and bottom side of a substrate to reduce impedance, in accordance with embodiments.

Embodiments of the present disclosure may generally relate to systems, apparatus, and/or processes directed to facilitating increased clock speeds on a substrate by lowering the impedance of traces that provide clock signals to components such as dynamic random access memory (DRAM). For example, embodiments may include a substrate with a first layer and a second layer parallel to the first layer with a first trace coupled with the first layer in a routing configuration and a second trace coupled with the second layer in the routing configuration, where the routing configuration of the first trace and the second trace substantially overlap each other with respect to an axis perpendicular to the first layer and the second layer, and where the first trace and the second trace are electrically coupled by a first and a second electrical coupling perpendicular to the first layer and the second layer. In other embodiments, the trace may be a differential routing trace. Techniques described herein may also be used to lower the impedance of traces connecting any two points on substrate or a PCB.

Embodiments described herein may facilitate increasing clock speeds of existing substrate designs while maintaining device reliability by reducing the impedance in traces that electrically couple a clock signal generator with one or more components on the substrate. In embodiments, the impedance may be lowered by providing additional trace routings on a layer of the substrate that have the same or similar geometries that are on another layer of the substrate. These trace routings are then electrically coupled on both sides using a plated through hole (PTH) or via. This approach to creating these parallel traces may also be referred to as tween routing. Embodiments may also be directed to low impedance differential routing, for example differential pairs from a clock, across multiple layers of PCB routing in trace geometries that are of standard size, in non-limiting examples, such as 50 ohm nets with trace width of around 60 to 75 um The embodiments described herein may facilitate increased clock speed for a PCB or a substrate without requiring PCB technology or strategy modifications. In embodiments, duplicating a trace routing having a similar geometry of a first side of a PCB onto a second side of a PCB need not fundamentally change the PCB design because the routing on the second side will have already taken into consideration board shapes, features, through holes, etc. of the PCB. The routing on the first side and the second side may then be electrically coupled, or shorted, through existing vias, for example at each DRAM and position, on the PCB.

For example, embodiments may facilitate increasing DDR5 clock speeds on a substrate to increase overall device performance while maintaining device reliability. DDR technology enables the transfer of data on both the rising and falling edges of a clock signal. As clock speeds increase, requirements for the shape of these rising and falling edge signals, which may be referred to as clock signal swings, need to be met to maintain device reliability. A low impedance layout environment may be used to meet the desired signal swing. The necessary differential impedance can be achieved through embodiments described herein.

Embodiments may be directed to the CLK data lines, as well as other related clock data lines. The DDR interface is a wide, parallel interface. Proper implementation of DDR involves at least three important timings; The 'CA' (Command Address) is sampled by the 'CLK' (Clock), 'DQ' (Data) is sampled by the 'DQS' (Data Strobe) and finally the 'CLK' and 'DQS' being aligned so the domain crossing between the 'CLK' and 'DQS' happens properly. In order to make all these timings optimal to maintain device reliability, various trainings may be implemented that may include: OCD or ZQ calibration; RD training (read training pattern) to align the DQS/DQ; and CA training to tune the CA relationship to CLK.

By reducing impedance on DDR5 clock traces, the market viability of products that include existing substrate designs that implement DDR5, or other similar technologies, may be extended by increasing the clock speed on the substrate. Thus, serving components on all or part of the substrate may achieve an end of life (EOL) clock speed. EOL clock speed is the maximum clock speed for a PCB or substrate design that will allow device operation within reliability parameters. In legacy substrate designs, DDR5 CLK, which includes high speed multi-drop signals, may not meet the minimum voltage amplitude required by the receiving circuit to correctly capture data at DDR5 EOL speeds on substrates that use a traditional layout strategy. Attempts to get a clock speed faster than an EOL clock speed call for a substrate redesign. It should be noted that embodiments described herein may apply to routings of other signals on a PCB or substrate, whether DDR or not.

Embodiments may be directed to any components on a substrate including but not limited to an unregistered dual in-line memory module (UDIMM), non-volatile DIMM (NVDIMM), registered DIMM (RDIMM), double data rate type 5 (DDR5) memory, low power DDR5 (LPDDR5), Optane® memory, and the like.

Legacy approaches to increasing clock speed include adding additional clocks to PCB circuitry. However, this legacy approach introduces cost as well as higher power requirements, increased complexity, protocol difficulties, and may interfere with training capabilities such as finding an optimal CLK phase for all CA signals within a CLK domain as now CA signals would belong to multiple CLK domains.

Other legacy approaches include widening existing traces on the substrate. However, this may reduce reliability by increasing cross talk or other signal distortions by reducing margins around the traces. In addition, there may not be the physical space available to widen traces, particularly through DRAM via fields. In addition, widening the traces may be difficult to fit into a substrate because of various vias, verticals, and other obstacles on the substrate layout where a widened trace may not fit.

Embodiments, as described herein, reduce the impedance of clock signal traces and substantially maintain the original substrate design and layout strategy. Embodiments may enable DDR5 CLK to achieve EOL speeds without designing and implementing additional CLK copies, remove the complexity and cost increments inherent to additional CLK copies, and facilitate CA to CLK training complexity. Techniques described herein may improve scaling of clock speeds for an EOL DDR5 by up to two times as compared to single-layer routing, without increasing the clock outputs and increasing power, cost and complexity.

Embodiments also have the advantage of not requiring a stackup or technology change nor do they disturb other nets and represents minimal additional CAD effort to design and implement. In addition, these embodiments, in comparison with legacy implementations, result in less susceptibility to large input/output (I/O) circuit pad capacitance at the silicon level (Cdie) or variations in DRAM package length. A large Cdie may result in legacy implementations that reduce margins next to a trace. The amount of margin requires for reliable substrate operation may vary based on capacitance. Due to signal on the traces back up to a DRAM package, higher frequency reflections may result from an impedance mismatch. Using embodiments and techniques described herein, lower impedance will mean there are less reflections happening from a mismatch.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 is an example of differential trace routing on a top and bottom side of a substrate to reduce impedance, in accordance with embodiments. Diagram 100 shows an example substrate that includes a first set of traces 102 applied to a first side of the substrate (for clarity, the substrate is not shown) that are electrically coupled through vias 108 that extend from the first side to a second side of the substrate (not shown), to multiple DRAMs 112a-112e. The first set traces 102 are electrically coupled with a register integrated circuit (RCD) 110, which may be referred to herein as a clock signal generator 110. In embodiments, these traces may include copper (Cu) or other conductive elements or alloys that are placed on the surface of the substrate.

The clock signal generator 110 may provide a clock signal to each of the multiple DRAMS 112a-112e through the first set of traces 102. However, the impedance level of the first set of traces 102 may be high enough such that the clock signal generator 110, when operating at a higher clock speed, may produce signals that are not usable by one or more of the DRAMs 112a-112e. As a result, the substrate 100 during operation at a higher clock speed may not achieve reliability goals. As clock speeds increase, requirements for the shape of these rising and falling edge signals, which may be referred to as clock signal swings, need to be met to maintain DRAM 112a-112e reliability.

To support a higher clock speed while maintaining reliability parameters, a second set of traces 104 are applied to a second side of the substrate (not shown). The second set of traces 104 are electrically coupled with the first set of traces 102 by the vias 108, as a result of this electrical coupling, provides a reduced electrical impedance between the clock signal generator 110 and the DRAMs 112a-112e. This reduced impedance facilitates cleaner clock signal swings, and is therefore able to drive the DRAMs 112a-112e at a higher clock speed.

In embodiments, the second set of traces 104 have the same or similar geometry of the first set of traces 102. For example, in diagram 100, the first set of traces 102 and the second set of traces 104 are stacked vertically on either side of the substrate (not shown) when viewed perpendicular to the plane of the substrate. By duplicating the trace geometry, the substrate design does not need to fundamentally change and portions of existing trace routings on the first side of the substrate are duplicated on the other side of the substrate. The layout of the first set of traces 102 have already taken into consideration board shapes, features, through holes, etc. of the substrate so that the second set of traces 104 will avoid them as well. The routing on the first side and the second side may then be electrically coupled, or shorted, through existing vias 108, for example at each DRAM 112a-112e position, on the substrate. In embodiments, the first set of traces 102 and the second set of traces 104 may be coupled in various locations by vias or PTH (not shown).

Diagram 100a is an exploded view of a portion of diagram 100 that shows a set of vias 108a, 108b that connect a CLK differential pair 102a, 102b electrically coupled with the clock signal generator 110. The first via 108a electrically coupled with the first differential pair 102a of the first set of traces 102 is also electrically coupled with the first differential pair 104a of the second set of traces 104. Similarly, the second via 108b electrically coupled with the second differential pair 102b of the first set of traces 102 is also electrically coupled with the second differential pair 104b of the second set of traces 104. For reference, a via 116 that is unrelated to the clock signal may be electrically connected to a trace 114 on only one side of the substrate.

Embodiments of tween routing may be directed to any multi-drop DDR implementations, both client and server, including without limitation to a UDIMM, NVDIMM, RDIMM, DDR5, LPDDR5, Optane, etc.

Although FIG. 1 shows a clock signal generator 110 servicing multiple components (DRAMs 112a-112e), which may be referred to as multi-drop, embodiments employing these techniques may also reduce impedance between any two components on the substrate in a point-to-point fashion.

Figure 2:
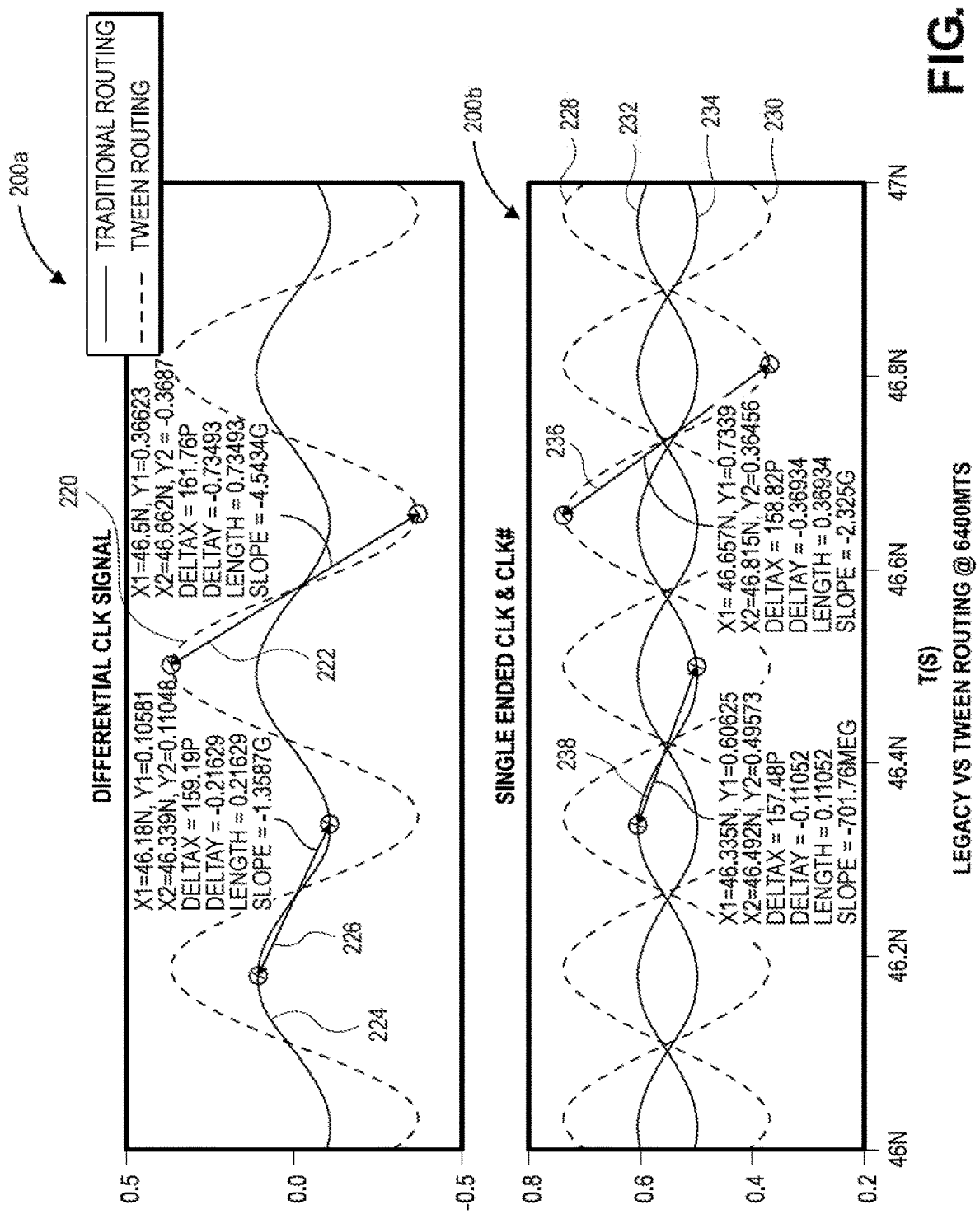
FIG. 2 shows an example of a performance comparison of tween routing at 6400 mega transfers per second (MTS), in accordance with embodiments.

FIG. 2 shows an example of a performance comparison of tween routing at 6400 MTS, in accordance with embodiments. Diagram 200a shows a graph of a differential CLK signal showing time and voltage. A legacy implementation voltage signal 224 having a peak to trough slope 226 may be compared to a tween routing voltage signal 220 having a peak to trough slope 222 implemented with lower impedance. The increased slope of tween routing peak to trough slope 222 is substantially greater then legacy peak to trough slope 226, and also the amplitude of the tween routing voltage signal 220 in comparison to the legacy voltage signal 224 is substantially greater. This indicates that the lower impedance tween routing approach provides a stronger clock signal between the clock generator, such as clock generator 110 of FIG. 1, and one or more components receiving the clock signal, for example DRAMs 112a-112e of FIG. 1. As a result, the clock speed may be increased without loss of device reliability.

Diagram 200b shows a graph of a single ended CLK and CLK# showing voltage against time in nanoseconds. In embodiments, a differential pair, such as a DDR CLK includes two single ended signals, or nets, both carrying the same information, but with different polarities. One net is referred to as the positive or true, and the other as the negative or complement. The complement signal is traditionally designed by the same name as the positive with a '#' suffix, pronounced "bar" or "not." Two legacy voltages 232, 234 are shown having a peak to trough slope 238 that is substantially shallower than the peak to trough slope 236 corresponding to the tween routing voltages 228, 230. This indicates that the tween routing clock signals are stronger, and as a result the clock speeds may be increased without loss of device reliability.

Figure 3:
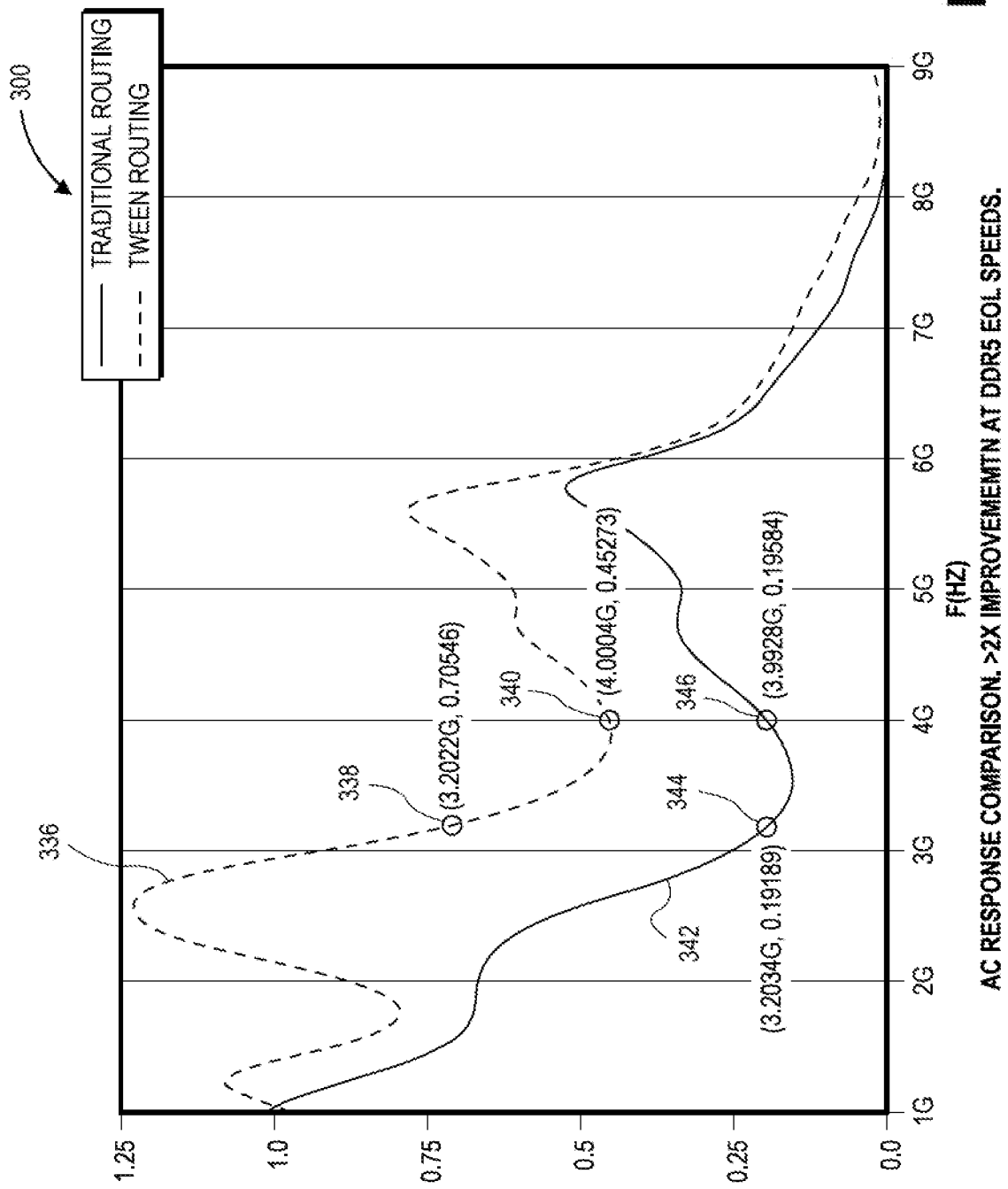
FIG. 3 illustrates an example an AC response comparison with a double data rate (DDR) 5 clock at end of life (EOL) speeds, in accordance with embodiments.

FIG. 3 illustrates an example an AC response comparison with DDR5 at end of life (EOL) speeds, in accordance with embodiments. Diagram 300 shows a transfer function graph of magnitude vs. frequency at a DRAM furthest from a CLK generator. A line indicating legacy routing performance 342 when compared with the line indicating tween routing performance 336, shows superior performance of tween routing over legacy routing. The higher magnitude in this graph indicates a higher signal, which means more of the transmitted signal actually reaches the receiver. For example, at legacy location 344 on the graph as compared to tween routing location 338, the performance of tween routing is greater than three times that of legacy routing. In another example, at legacy location 346 on the graph as compared to tween routing location 340, the performance of tween routing is greater than two times that of legacy routing.

Figure 4:
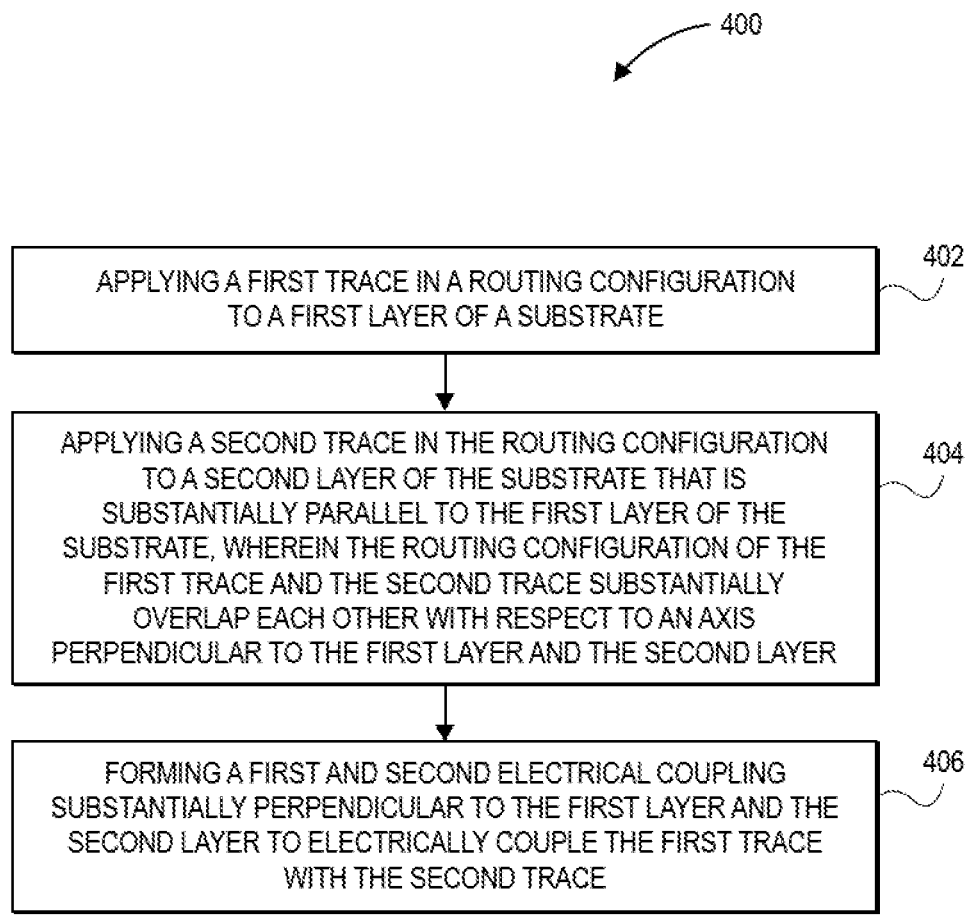
FIG. 4 illustrates an example process for implementing differential trace routing on a top and bottom side of a PCB, in accordance with embodiments.

FIG. 4 illustrates an example process for implementing differential trace routing on a top and bottom side of a PCB, in accordance with embodiments. Process 400 may be performed by one or more elements, techniques, or systems that may be found in FIG. 1.

At block 402, the process may include applying a first trace in a routing configuration to a first layer of a substrate. In embodiments, the first trace routing may correspond to the first set of traces 102 of FIG. 1. The first trace may also correspond to a differential pair as shown by 102a and 102b of diagram 100a.

At block 404, the process may further include applying a second trace in the routing configuration to a second layer of the substrate that is substantially parallel to the first layer of the substrate, wherein the routing configuration of the first trace and the second trace substantially overlap each other with respect to an axis perpendicular to the first layer and the second layer. In embodiments, the second trace may correspond to the second set of traces 104 of FIG. 1, and may also correspond to a differential pair as shown by 104a and 104b of diagram 100a.

As shown in diagram 100, the first set of traces 102 and the second set of traces 104 overlap each other with respect to an axis perpendicular to the plane of the substrate (not shown). In embodiments, the axis perpendicular to the plane may be seen by the orientation of the vias 108 that, in diagram 100, are perpendicular to the plane of the substrate.

At block 406, the process may further include for forming a first and a second electrical coupling substantially perpendicular to the first layer and the second layer to electrically couple the first trace with the second trace. In embodiments, the electrical coupling may correspond to the vias 108 that electrically couple the first set of traces 102 with the second set of traces 104.

As shown in diagram 100a, embodiments may include the first via 108a that is electrically coupled with the first differential pair 102a of the first set of traces 102 and also electrically coupled with the first differential pair 104a of the second set of traces 104. Embodiments may also include the second via 108b electrically coupled with the second differential pair 102b of the first set of traces 102 that is electrically coupled with the second differential pair 104b of the second set of traces 104. In other embodiments, the electrical couplings may include vias 108 that that are located at or located proximate to one or more of DRAMs 112a-112e.

In embodiments, the blocks of process 400 may be performed in any sequence. In embodiments, one or more blocks of the process 400 may be omitted.

Figure 5:
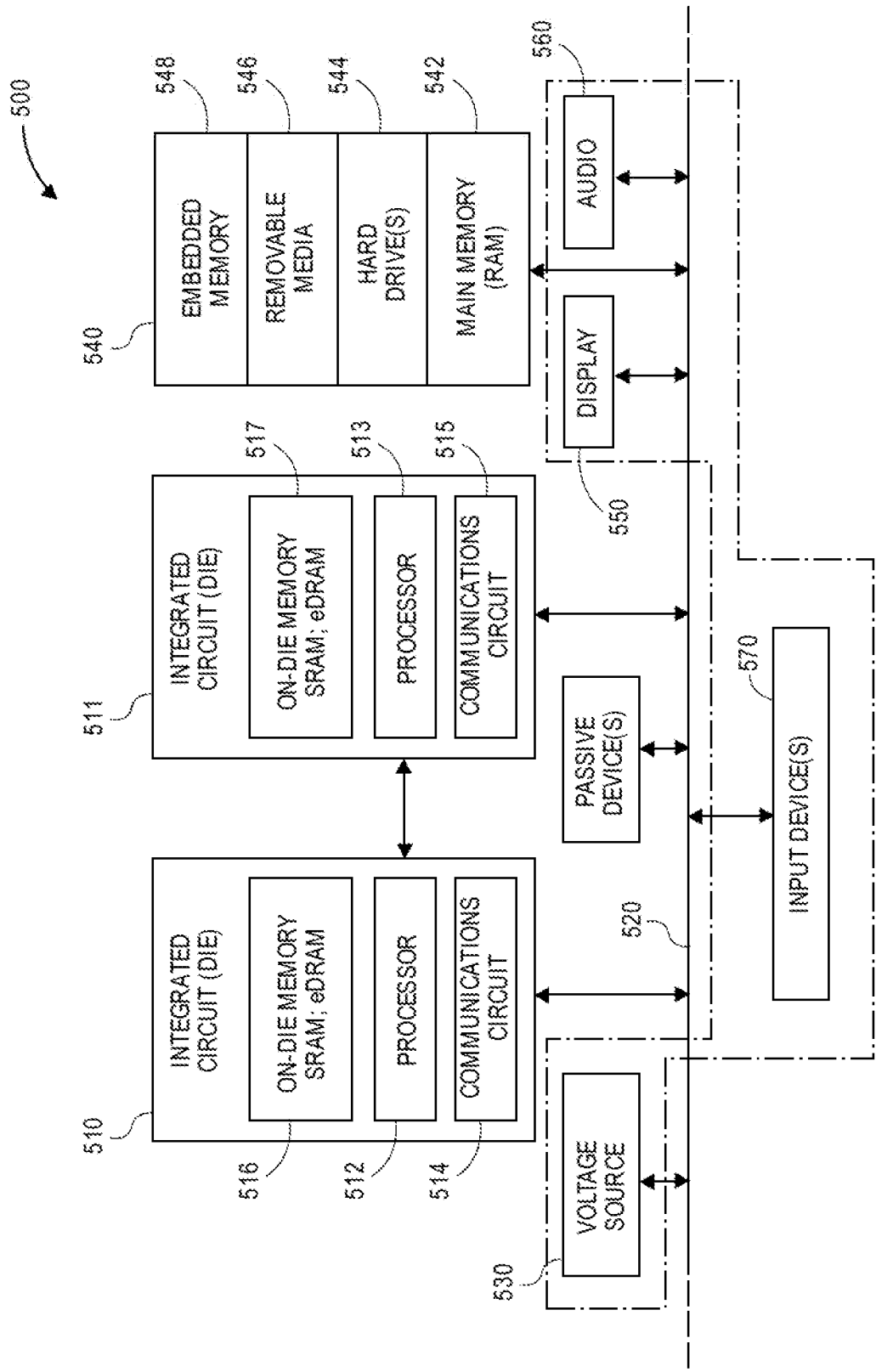
FIG. 5 schematically illustrates a computing device, in accordance with embodiments.

FIG. 5 schematically illustrates a computing device, in accordance with embodiments. The computer system 500 (also referred to as the electronic system 500) as depicted can embody tween differential trace routing, according to any of the several disclosed embodiments and their equivalents as set forth in this disclosure. The computer system 500 may be a mobile device such as a netbook computer. The computer system 500 may be a mobile device such as a wireless smart phone. The computer system 500 may be a desktop computer. The computer system 500 may be a hand-held reader. The computer system 500 may be a server system. The computer system 500 may be a supercomputer or high-performance computing system.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled with the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, magnetic cores cured using structures within a substrate layer, as disclosed herein. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In an embodiment, the electronic system 500 also includes a display device 550, an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a package substrate having tween differential trace routing, according to any of the several disclosed embodiments and their equivalents, an electronic system, a computer system, one or more methods of fabricating an integrated circuit, and one or more methods of fabricating an electronic assembly that includes a package substrate having tween differential trace routing, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having tween differential trace routing embodiments and their equivalents. A foundation substrate may be included, as represented by the dashed line of FIG. 5. Passive devices may also be included, as is also depicted in FIG. 5.

EXAMPLES

The following paragraphs describe examples of various embodiments.

Example 1 is an apparatus comprising: a substrate with a first layer and a second layer parallel to the first layer; a first trace coupled with the first layer in a routing configuration; a second trace coupled with the second layer in the routing configuration, wherein the routing configuration of the first trace and the second trace substantially overlap each other with respect to an axis perpendicular to the first layer and the second layer; and wherein the first trace and the second trace are electrically coupled by a first and a second electrical coupling perpendicular to the first layer and the second layer.

Example 2 includes the apparatus of example 1, wherein the first or the second electrical coupling is a via.

Example 3 includes the apparatus of example 1, wherein the first layer is a first side of the substrate and the second layer is a second side of the substrate opposite the first side.

Example 4 includes the apparatus of example 1, wherein the first trace or the second trace are copper traces.

Example 5 includes the apparatus of example 1, wherein the first electrical coupling is connected to a clock.

Example 6 includes the apparatus of example 1, wherein the first electrical coupling is to send a clock signal through the first trace and the second trace.

Example 7 includes the apparatus of example 6, wherein the second electrical coupling is electrically connected to a package.

Example 8 includes the apparatus of example 7, wherein the package includes a DRAM to receive the clock signal.

Example 9 includes the apparatus of any one of examples 1-6, wherein the package is a first package; further comprising: a third electrical coupling perpendicular to the first layer and the second layer and electrically coupled with the first trace and the second trace; wherein the third coupling is electrically connected to a second package; electrically connected to the third coupling; and wherein a DRAM in the second package is to receive the clock signal.

Example 10 includes the apparatus of any one of examples 1-9, wherein the substrate is a printed circuit board (PCB).

Example 11 is a system comprising: a substrate including: a first layer and a second layer parallel to the first layer; a first trace coupled with the first layer in a routing configuration; a second trace coupled with the second layer in the routing configuration, wherein the routing configuration of the first trace and the second trace substantially overlap each other with respect to an axis perpendicular to the first layer and the second layer; and wherein the first trace and the second trace are electrically coupled by a first and a second electrical coupling substantially perpendicular to the first layer and the second layer; and a clock electrically coupled with the first electrical coupling to provide a clock signal through the first trace and the second trace.

Example 12 includes the system of example 11, wherein the first layer is a first side of the substrate and the second layer is a second side of the substrate opposite the first side.

Example 13 includes the system of example 11, further comprising a package electrically coupled with the second electrical coupling to receive the clock signal.

Example 14 includes the system of example 13, wherein the package includes a double data rate (DDR) memory or dynamic random access memory (DRAM).

Example 15 includes the system of any one of examples 11-14, wherein the substrate further includes a third electrical coupling perpendicular to the first layer and the second layer and electrically coupled with the first trace and the second trace.

Example 16 includes the system of example 15, wherein the package is a first package; a second package electrically connected to the third electrical coupling; and wherein the first package and the second package are to receive the clock signal.

Example 17 includes the system of example 16, wherein the second package includes DDR memory.

Example 18 includes the system of example 11, wherein the first and second electrical coupling are vias.

Example 19 includes the system of example 11, wherein the substrate is a PCB.

Example 20 is an apparatus comprising: means for applying a first trace in a routing configuration to a first layer of a substrate; means for applying a second trace in the routing configuration to a second layer of the substrate that is substantially parallel to the first layer of the substrate, wherein the routing configuration of the first trace and the second trace substantially overlap each other with respect to an axis perpendicular to the first layer and the second layer; and means for forming a first and a second electrical coupling substantially perpendicular to the first layer and the second layer to electrically couple the first trace with the second trace.

Example 21 includes the apparatus of example 20, further comprising: means for electrically coupling a clock with the first electrical coupling; and means for electrically coupling a package with the second electrical coupling.

Example 22 includes the apparatus of example 20, wherein the first or the second electrical coupling is a via or plated through-hole (PTH).

Example 23 includes the apparatus of example 20, wherein the package includes a DRAM.

Example 24 includes the apparatus of example 20, wherein the first layer is a first side of the substrate and the second layer is a second side of the substrate opposite the first side.

Example 25 includes the apparatus of any one of examples 20-24, further including means for forming a first and a second electrical coupling substantially perpendicular to the first layer and the second layer to electrically couple the first trace with the second trace.

Various embodiments may include any suitable combination of the above-described embodiments including alternative (or) embodiments of embodiments that are described in conjunctive form (and) above (e.g., the "and" may be "and/or"). Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
    a substrate with a first layer and a second layer parallel to the first layer;
    a first trace coupled with the first layer in a routing configuration;
    a second trace coupled with the second layer in the routing configuration, wherein the routing configuration of the first trace and the second trace substantially overlap each other with respect to an axis perpendicular to the first layer and the second layer; and
    wherein the first trace and the second trace are electrically coupled by a first and a second electrical coupling perpendicular to the first layer and the second layer, the first electrically coupling laterally spaced apart from the second electrical coupling, and wherein there is no trace intervening vertically between the first trace and the second trace.

2. The apparatus of claim 1, wherein the first or the second electrical coupling is a via.

3. The apparatus of claim 1, wherein the first layer is a first side of the substrate and the second layer is a second side of the substrate opposite the first side.

4. The apparatus of claim 1, wherein the first trace or the second trace are copper traces.

5. The apparatus of claim 1, wherein the first electrical coupling is connected to a clock.

6. The apparatus of claim 1, wherein the first electrical coupling is to send a clock signal through the first trace and the second trace.

7. The apparatus of claim 6, wherein the second electrical coupling is electrically connected to a package.

8. The apparatus of claim 7, wherein the package includes a DRAM to receive the clock signal.

9. The apparatus of claim 6, wherein the package is a first package;
further comprising:
a third electrical coupling perpendicular to the first layer and the second layer and electrically coupled with the first trace and the second trace;
wherein the third coupling is electrically connected to a second package; and
wherein a DRAM in the second package is to receive the clock signal.

10. The apparatus of claim 1, wherein the substrate is a printed circuit board (PCB).

11. A system comprising:
a substrate including:
a first layer and a second layer parallel to the first layer;
a first trace coupled with the first layer in a routing configuration;
a second trace coupled with the second layer in the routing configuration, wherein the routing configuration of the first trace and the second trace substantially overlap each other with respect to an axis perpendicular to the first layer and the second layer; and
wherein the first trace and the second trace are electrically coupled by a first and a second electrical coupling substantially perpendicular to the first layer and the second layer, the first electrically coupling laterally spaced apart from the second electrical coupling, and wherein there is no trace intervening vertically between the first trace and the second trace; and
a clock electrically coupled with the first electrical coupling to provide a clock signal through the first trace and the second trace.

12. The system of claim 11, wherein the first layer is a first side of the substrate and the second layer is a second side of the substrate opposite the first side.

13. The system of claim 11, further comprising a package electrically coupled with the second electrical coupling to receive the clock signal.

14. The system of claim 13, wherein the package includes a double data rate (DDR) memory or dynamic random access memory (DRAM).

15. The system of claim 13, wherein the substrate further includes a third electrical coupling perpendicular to the first layer and the second layer and electrically coupled with the first trace and the second trace.

16. The system of claim 15, wherein the package is a first package;
a second package electrically connected to the third electrical coupling; and
wherein the first package and the second package are to receive the clock signal.

17. The system of claim 16, wherein the second package includes DDR memory.

18. The system of claim 11, wherein the first and second electrical coupling are vias.

19. The system of claim 11, wherein the substrate is a PCB.

20. An apparatus comprising:
means for applying a first trace in a routing configuration to a first layer of a substrate;
means for applying a second trace in the routing configuration to a second layer of the substrate that is substantially parallel to the first layer of the substrate, wherein the routing configuration of the first trace and the second trace substantially overlap each other with respect to an axis perpendicular to the first layer and the second layer, and wherein there is no trace intervening vertically between the first trace and the second trace; and
means for forming a first and a second electrical coupling substantially perpendicular to the first layer and the second layer to electrically couple the first trace with the second trace, the first electrically coupling laterally spaced apart from the second electrical coupling.

21. The apparatus of claim 20, further comprising:
means for electrically coupling a clock with the first electrical coupling; and
means for electrically coupling a package with the second electrical coupling.

22. The apparatus of claim 20, wherein the first or the second electrical coupling is a via or plated through-hole (PTH).

23. The apparatus of claim 20, wherein the package includes a DRAM.

24. The apparatus of claim 20, wherein the first layer is a first side of the substrate and the second layer is a second side of the substrate opposite the first side.

25. The apparatus of claim 20, further including means for forming a first and a second electrical coupling substantially perpendicular to the first layer and the second layer to electrically couple the first trace with the second trace.

26. An apparatus comprising:
a first package comprising:
a substrate with a first layer and a second layer parallel to the first layer;
a first trace coupled with the first layer in a routing configuration;
a second trace coupled with the second layer in the routing configuration, wherein the routing configuration of the first trace and the second trace substantially overlap each other with respect to an axis perpendicular to the first layer and the second layer, wherein the first trace and the second trace are electrically coupled by a first and a second electrical coupling perpendicular to the first layer and the second layer, wherein the first electrical coupling is to send a clock signal through the first trace and the second trace;
a third electrical coupling perpendicular to the first layer and the second layer and electrically coupled with the first trace and the second trace; and
a second package, wherein the third coupling is electrically connected to the second package, and wherein a DRAM in the second package is to receive the clock signal.

* * * * *